United States Patent
Takubo

(10) Patent No.: US 11,407,237 B2
(45) Date of Patent: Aug. 9, 2022

(54) LIGHT-IRRADIATING DEVICE AND PRINTING DEVICE

(71) Applicant: KYOCERA Corporation, Kyoto (JP)

(72) Inventor: Masami Takubo, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/260,591

(22) PCT Filed: Jul. 25, 2019

(86) PCT No.: PCT/JP2019/029204
§ 371 (c)(1),
(2) Date: Jan. 15, 2021

(87) PCT Pub. No.: WO2020/022424
PCT Pub. Date: Jan. 30, 2020

(65) Prior Publication Data
US 2021/0323322 A1    Oct. 21, 2021

(30) Foreign Application Priority Data
Jul. 27, 2018    (JP) .............................. JP2018-141333

(51) Int. Cl.
*B41J 11/00*    (2006.01)
(52) U.S. Cl.
CPC .............. *B41J 11/00214* (2021.01)
(58) Field of Classification Search
CPC .............. B41J 11/00214; B41J 11/0015; B41J 11/0021; H01L 33/58; H01L 33/60; B41F 23/0409
See application file for complete search history.

(56) References Cited

U.S. PATENT DOCUMENTS

| | | | |
|---|---|---|---|
| 4,135,098 A | 1/1979 | Troue | |
| 6,185,840 B1 | 2/2001 | Noelle et al. | |
| 2019/0054745 A1* | 2/2019 | Taguchi | ................. B01J 19/123 |

FOREIGN PATENT DOCUMENTS

| | | |
|---|---|---|
| JP | 2005-081277 A | 3/2005 |
| JP | 2008-244165 A | 10/2008 |
| WO | 2017/077460 A1 | 5/2017 |
| WO | 2017/170949 A1 | 10/2017 |

* cited by examiner

*Primary Examiner* — Bradley W Thies
(74) *Attorney, Agent, or Firm* — Volpe Koenig

(57) ABSTRACT

A light-irradiating device according to the disclosure includes: a light-emitting element; a housing in which the light-emitting element is disposed, the housing including a light-irradiating surface provided with an irradiating opening which is capable of allowing light from the light-emitting element to pass therethrough; a flow path configured to supply gas, the flow path including an end located near the irradiating opening of the light-irradiating surface of the housing; and a discharging port configured to discharge the gas, the discharging port being disposed at the end of the flow path, the discharging port including a plurality of first openings arranged in a width direction of the irradiating opening in correspondence with the irradiating opening, and a second opening positioned in correspondence with each end in the width direction of the irradiating opening. This makes it possible to reduce uneven distribution of discharged gas improve the reliability of a curing reaction.

11 Claims, 4 Drawing Sheets

LIGHT-IRRADIATING DEVICE AND PRINTING DEVICE

CROSS-REFERENCE TO RELATED APPLICATION

This application is a national stage entry according to 35 U.S.C. 371 of International Application No. PCT/JP2019/029204 filed on Jul. 25, 2019, which claims priority to Japanese Patent Application No. 2018-141333 filed on Jul. 27, 2018, the contents of which are entirely incorporated herein by reference.

TECHNICAL FIELD

The present disclosure relates to a light-irradiating device that can be used to cure an ultraviolet-curable resin, ink, etc., and also relates to a printing device including the same.

BACKGROUND

Among light-irradiating devices of the type including a light source and a drive substrate for driving the light source each received in a housing, there are some that employ, for example, a lamp or LED (Light Emitting Diode) designed for ultraviolet emission as the light source. Such a light-irradiating device capable of ultraviolet irradiation finds extensive application in various fields, for example, in addition to a printing field for purposes of the cure of a photo-curable material (resin, ink, etc.), etc., a medical-related field for purposes of disinfection, etc., a manufacturing-assembly field for purposes of the cure of an adhesive or an ultraviolet-curable resin in the process of mounting electronic components, etc., and a drying treatment field for purposes of efficient drying of an object under infrared irradiation, etc. (refer to Japanese Unexamined Patent Publication JP-A 2008-244165, for example).

In the printing field, in particular, the capability of rapid cure of a photo-curable material is demanded, but radicals generated in the process of application of light to a photo-curable material may react with atmospheric oxygen, which may inhibit a curing reaction of resin or ink.

There has been a growing demand for a light-irradiating device that achieves improvement in the cure of a photo-curable material by reducing oxygen in an atmosphere for cure.

SUMMARY

A light-irradiating device according to the disclosure includes: a light-emitting element; a housing in which the light-emitting element is disposed, the housing including a light-irradiating surface provided with an irradiating opening which allows light from the light-emitting element to pass therethrough, the irradiating opening extending in a width direction of the light-irradiating surface; a flow path configured to supply gas, the flow path including an end located near the irradiating opening of the light-irradiating surface of the housing; and a discharging port configured to discharge the gas, the discharging port disposed at the end of the flow path, the discharging port including a plurality of first openings which are each shaped in a circular hole arranged in a range of an area in the width direction corresponding to the irradiating opening, and a second opening as a narrow elongate form positioned in correspondence with each end in the width direction in conformity with the area.

A light cure device according to the disclosure includes: the light-irradiating device according to the disclosure; and a conveying section configured to convey a photo-curable material to which the gas from the discharging port of the light-irradiating device is supplied and which is irradiated with light from the irradiating opening.

A printing device according to the disclosure includes: the light cure device according to the disclosure; and a printing section configured to print photo-curable ink on a medium for printing as the photo-curable material.

DETAILED DESCRIPTION

Embodiments of a light-irradiating device, a light cure device, and a printing device according to the disclosure will now be described with reference to drawings. Following is for purposes of illustration of the embodiments of the disclosure, and hence the disclosure is not limited to the following embodiments.

Figure 1A:
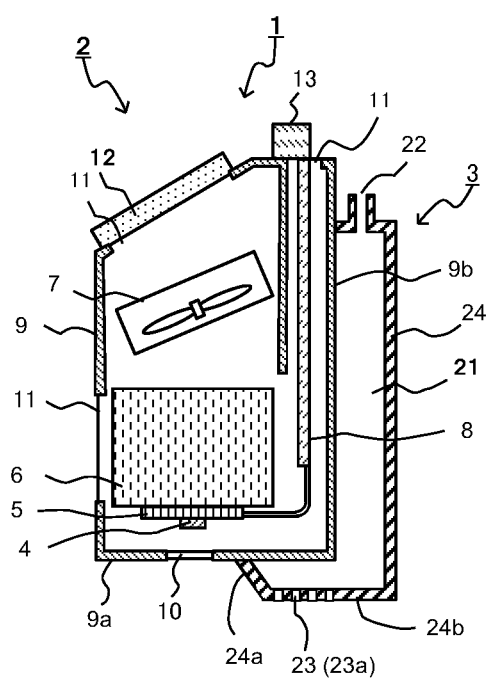
FIG. 1A is a side view of an embodiment of a light-irradiating device according to the disclosure.
Figure 1B:
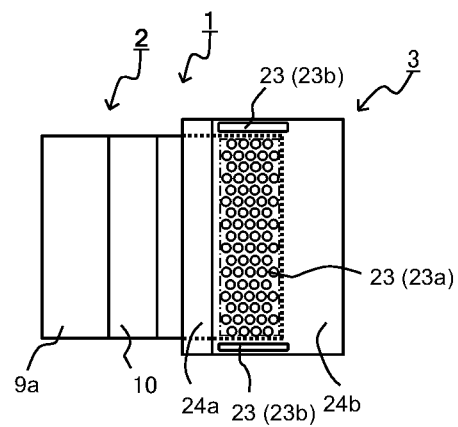
FIG. 1B is a bottom view thereof.

An embodiment of the light-irradiating device according to the disclosure is schematically shown in FIGS. 1A and 1B. FIG. 1A is a side view of the light-irradiating device, and FIG. 1B is a bottom view thereof.

The light-irradiating device 1 is configured to cure a photo-curable material by the irradiation of light (e.g. ultraviolet light). The light-irradiating device 1 is installed as a light cure device in a printing device such as an offset printing device or an ink-jet printing device. According to such a configuration, the printing device can print a photo-curable material (e.g. photo-curable ink such as ultraviolet-curable ink) on a medium for printing by applying the photo-curable material adherently onto the medium for printing by a printing section of the printing device, and thereafter curing the photo-curable material by the light-irradiating device 1.

The light-irradiating device 1 includes a light-irradiating section 2 and a gas supply section 3. In the light-irradiating device 1 according to the disclosure including the light-irradiating section 2 and the gas supply section 3, in the process of curing a photo-curable material, while the gas supply section 3 is supplying a gaseous material (gas) into between the light-irradiating device 1 and the medium for printing, the light-irradiating section 2 can carry out light application. This makes it possible to reduce the occurrence of a reaction between radicals and atmospheric oxygen by using oxygen-free gas, e.g. nitrogen gas, as the gas, and thereby achieve improvement in the cure of the photo-curable material. The light-irradiating device 1 may be produced by a heretofore known method.

The light-irradiating section 2 is internally provided with a light-emitting element 4 and can apply light to the non-illustrated medium for printing or the like. The light-irradiating section 2 includes the light-emitting element 4, a substrate 5 on which the light-emitting element 4 is mounted, a heat sink 6 serving as a heat-dissipating member which is thermally connected to the substrate 5, a cooling fan 7 capable of blowing air on the heat sink 6, a drive substrate 8 which drives the light-emitting element 4, and a housing 9 which receives the aforenamed components therein. The housing 9 includes, at a bottom thereof, a light-irradiating surface 9a provided with an irradiating opening 10 which is capable of allowing light to pass therethrough to permit external irradiation of light from the light-emitting element 4.

Moreover, the housing 9 is provided with a plurality of ventilating slots 11 which is capable of supplying and discharging external air therethrough for enhancing heat-dissipation effect of the heat sink 6. One or some of the ventilating slots 11 are provided with a filter 12. Moreover, via one or some of the ventilating slots 11, there is provided a connector 13, which is electrically connected to the drive substrate 8, for external supply of power and driving signals to the drive substrate 8.

Figure 2A:
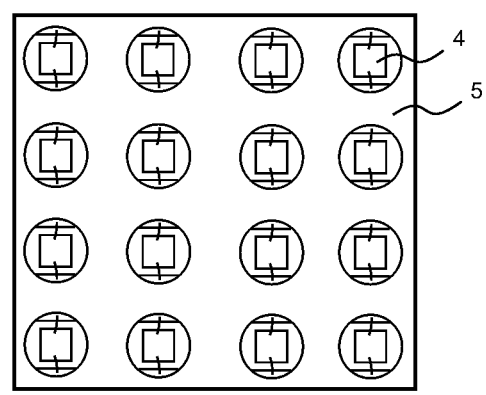
FIG. 2A is a plan view of a light-irradiating section of the light-irradiating device shown in FIGS. 1A and 1B.
Figure 2B:
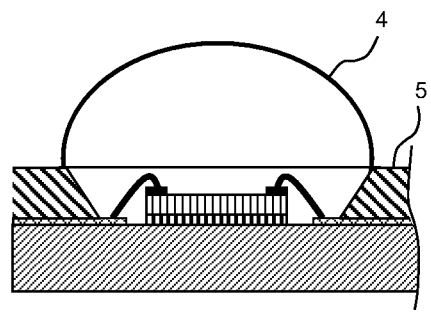
FIG. 2B is a sectional view thereof.

The light-emitting element 4 of the light-irradiating device 1 is schematically shown in FIGS. 2A and 2B. FIG. 2A is a schematic plan view showing the light-emitting element 4 and the substrate 5 as viewed in plan. FIG. 2B is a schematic sectional view showing the light-emitting element 4 and the substrate 5 as viewed in section.

The light-emitting element 4 can emit light (ultraviolet light). The light-emitting element 4 includes a plurality of semiconductor layers and a pair of electrodes. The plurality of semiconductor layers include an active layer, a p-type cladding layer, and an n-type cladding layer, and can emit light by applying a voltage via the pair of electrodes. For example, the plurality of semiconductor layers may be formed of gallium arsenide (GaAs) or gallium nitride (GaN). For example, the pair of electrodes may be formed of silver (Ag).

For example, Examples of the light-emitting element 4 may include an LD (Laser Diode) and LED. For example, the light-emitting element 4 may emits light of wavelengths in the ultraviolet region. More specifically, for example, a peak of the light spectrum may be from 280 nm to 440 nm. The wavelength of light from the light-emitting element 4 may be at any level needed to cure a photo-curable material.

The substrate 5 can support the light-emitting element 4. For example, the substrate 5 may have an exterior shape of a flat plate. For example, the substrate 5 may be rectangular in plan configuration. The substrate 5 is provided with a plurality of recesses, and the light-emitting element 4 is mounted in each recess. For example, an opening of the recess may be circularly shaped. The substrate 5 does not necessarily have to be provided with the recesses. In this case, the light-emitting element 4 may be mounted on an upper surface of the flat-shaped substrate 5.

The substrate 5 is constituted of a single insulating layer or a plurality of insulating layers. In other words, the substrate 5 includes a single insulating layer or a plurality of insulating layers. Examples of a material for the insulating layer may include ceramics such as an aluminum oxide sintered body, an aluminum nitride sintered body, a mullite sintered body, or glass ceramics, and resin such as an epoxy resin or a liquid crystal polymer.

The substrate 5 further includes wiring which is electrically connected to the light-emitting element 4 via a bonding wire, for example. Examples of the material for the wiring may include tungsten (W), molybdenum (Mo), manganese (Mn), and copper (Cu).

The light-emitting element 4 of this embodiment is sealed within the recess of the substrate 5 with a sealing material. Examples of the sealing material may include a silicone resin. The sealing material does not necessarily have to be provided for the light-emitting element 4.

As shown in FIG. 1A, the housing 9 includes the light-emitting surface 9a at a bottom thereof. The light-irradiating surface 9a is provided with the irradiating opening 10 which is capable of transmitting light from the light-emitting element 4 mounted within the housing 9 therethrough, and is a surface opposed to the medium for printing. Consequently, light from the mounted light-emitting element 4 can be applied to the medium for printing through the irradiating opening 10 of the light-irradiating surface 9a. As a rule, the irradiating opening 10 is provided with a light-transmitting member formed of glass or the like, as a cover member. Although there is no need for the light-transmitting member to be transmitted to light of each and every wavelength, preferably, the light-transmitting member may be capable of transmitting at least light having a wavelength required for curing the photo-curable material with an amount of light required for curing.

In the case where the housing 9 is designed for downward emission of irradiation light from the light-emitting element 4 through the light-irradiating surface 9a, for example, the housing 9 measures about 150 mm in vertical dimension, about 100 mm in horizontal dimension as viewed in FIG. 1A, and about 80 mm in depth-wise dimension. The housing 9 may be given any exterior shape suited to the intended use of the light-irradiating device 1. Examples of the exterior shape include a cubic shape, a triangular prism shape, a circular cylindrical shape, and a semicircular column shape. The housing 9 in this embodiment includes a slanted surface at a top thereof, and the filter 12 is disposed at the ventilating slot 11 provided in the slanted surface. Thus, the housing 9 is capable of efficient supply and discharge of air in relation to the cooling fan 7.

FIG. 1B shows the light-irradiating surface 9a of the housing 9. FIG. 1B is a bottom view of the housing 9, as seen from the light-irradiating surface 9a side. The dotted lines depicted in the drawing indicate the exterior shape of the light-irradiating surface 9a.

A part of the light-irradiating surface 9a other than the irradiating opening 10 may be formed as a light-blocking region. In this case, the light-irradiating surface 9a includes the irradiating opening 10 which is capable of allowing light from the light-emitting element 4 to pass therethrough, and non-light passing portions (unmarked) that are light-blocking regions arranged with the irradiating opening 10 lying in between. In this embodiment, as shown in FIG. 1B, the light-irradiating surface 9a includes the irradiating opening 10 and the non-light passing portions. The non-light passing portion does not necessarily have to have a light-blocking property with respect to light of each and every wavelength, and need only be capable of blocking light of certain wavelength that is passed through the irradiating opening 10. Moreover, depending on the design requirements for the light-irradiating section 2, the non-light passing portion may be formed so as to surround the irradiating opening 10.

For example, the irradiating opening 10 has the form of a rectangular opening, and may be provided with a plate-like cover member formed of a light-transmittable material as required. In this embodiment, the housing 9 is, except at the irradiating opening 10, formed of a light-blocking material. A surface of the housing 9 opposed to the medium for printing is provided with an opening which serves as the irradiating opening 10. With the cover member fitted in this opening, the light-irradiating surface 9a provided with the irradiating opening 10 is constituted.

For example, the light-irradiating surface 9a may be formed as a flat surface. Moreover, for example, the light-irradiating surface 9a may be rectangular-shaped. In the case where the light-irradiating surface 9a includes the irradiating opening 10 and the non-light passing portion, for example, the irradiating opening 10 may be given either a rectangular form or a strip-like form. Moreover, the irradiating opening 10 may be shaped so as to extend from one of the ends in the width direction of the light-irradiating surface 9a to the other end. Alternatively, the irradiating opening 10 may be dimensioned to fit within the light-irradiating surface 9a. In this case, part of the light-irradiating surface 9a lies outside each end of the irradiating opening 10.

Examples of a material for the cover member fitted in the irradiating opening 10 include quartz glass and BK7. Examples of a material for the non-light passing portion include aluminum (Al), stainless steel (SUS), and copper (Cu). In this embodiment, the housing 9 is, except at the irradiating opening 10, formed of the same material as a material constituting the non-light passing portion. The housing 9 may be, except at the light-irradiating surface 9a, formed of a material which differs from a material constituting the non-light passing portion. In this case, the housing 9 (exclusive of the light-irradiating surface 9a) is formed of aluminum (Al), stainless steel (SUS), or copper (Cu), for example.

As described above, the gas supply section 3 is capable of feeding gas, preferably, an inert gas such as an oxygen-free nitrogen ($N_2$) gas, to a space on a light-irradiating surface 9a side between the medium for printing and the light-irradiating device 1. By supplying the oxygen-free gas from the light-irradiating surface 9a side, it is possible to reduce the concentration of oxygen in an atmosphere surrounding the photo-curable material placed so as to face the light-irradiating surface 9a, for example, the photo-curable material printed on the medium for printing, and thereby reduce the occurrence of a reaction between oxygen and radicals resulting from application of light to the photo-curable material. Consequently, the factor that inhibits the curing reaction of the photo-curable material can be eliminated, with consequent improvement in the cure of the photo-curable material.

As shown in FIGS. 1A and 1B, the gas supply section 3 includes: a flow path 21, a supply port 22 disposed at the top of the flow path 21, and a discharging port 23 disposed at the bottom of the flow path 21. The gas supplied to the gas supply section 3 through the supply port 22 flows within the flow path 21, and is discharged from the discharging port 23. The gas discharged from the discharging port 23 is supplied to the space between the medium for printing and the light-irradiating surface 9a side of the light-irradiating device 1. For example, the supplied gas is preferably an inert gas such as a nitrogen ($N_2$) gas or an argon (Ar) gas. The supplied gas may be any gas which substantially contains no oxygen or any inert gas which is less reactive with radicals contained in the photo-curable material.

The flow path 21 includes a plurality of plate-like members 24. The flow path 21 in this case is constituted of the plurality of plate-like members 24. More specifically, a space surrounded by the plurality of mutually connected plate-like members 24 serves as the flow path 21. Examples of a material for forming the plate-like members 24 may include metal materials such as aluminum (Al), stainless steel (SUS), and copper (Cu), and resin materials such as an acrylic resin.

The gas supply section 3 is secured to the light-irradiating section 2 by fastening one or some of a plurality of the plate-like members 24 of the flow path 21 to the housing 9. One or some of the plurality of plate-like members 24 are adhesively bonded, screw-held, or otherwise fastened to the housing 9. With part of the flow path 21 fixedly contacted by the housing 9 in this way, it is also possible to improve heat dissipation from the housing 9 by the gas supplied to the flow path 21.

The supply port 22 and the discharging port 23 are located at both ends of the flow path 21. Openings surrounded by the plurality of plate-like members 24 may serve as the supply port 22 and the discharging port 23, or openings formed in one of a plurality of the plate-like members 24 may serve as the supply port 22 and the discharging port 23. The supply port 22 is connected to a gas supply source.

The flow path 21 is arranged so that an end thereof is located near the irradiating opening 10 of the light-irradiating surface 9a of the housing 9. The flow path 21 does not necessarily have to be shaped so as to be folded over onto the light-irradiating surface 9a. For example, the flow path 21 may be positioned so that the end thereof is located next to the light-irradiating surface 9a. The discharging port 23 located at the end of the flow path 21 includes: a plurality of first openings 23a which are each provided in the end of the flow path 21 so as to extend in the irradiation direction of light from the irradiating opening 10, and are arranged in the width direction of the irradiating opening 10 in correspondence with the irradiating opening 10; and a second opening 23b which is arranged in correspondence with each end in the width direction of the irradiating opening 10.

In this embodiment, the plurality of first openings 23a are each shaped in a circular hole, and are arranged along the width of the irradiating opening 10 in such a pattern as to cover a region to be irradiated with light. The alternate long and short dashed lines shown in FIG. 1B indicate the range of an area in which the first openings 23a are arranged. Within this range, the first openings 23a of varying sizes and shapes may be arranged in various patterns with consideration given to gas discharge distribution, etc. For example, the plurality of first openings 23a can be efficiently formed by punching processing. Meanwhile, the second opening 23b is positioned as a narrow elongate form such as a slit form in conformity with the area in which the first openings 23a are arranged so as to be located in correspondence with each end in the width direction of the irradiating opening 10. Since the discharging port 23 includes such a second opening 23b, although the amount of gas supplied at both ends in the width direction tends to be lower than at the center only by the emission from the first openings arranged over the width direction, a sufficient amount of gas supply can be secured at the both ends. This makes it possible to reduce uneven distribution of gas supply to the space between the light-irradiating surface 9a and the medium for printing subjected to light irradiation, and thus enables satisfactory curing reaction to occur throughout the entire area of the region to be irradiated with light, with consequent improvement in curability.

Although the gas supply section 3 is made larger in width than the light-irradiating section 2 in this embodiment, this does not constitute any structural limitation. There may be a case where a plurality of the light-irradiating devices 1 are arranged and combined into one system for use. In this case, the gas supply section 3 may be set to have a width which is less than or equal to the width of the light-irradiating section 2, so that gas supply is carried out via the arrangement of the first openings 23a and the second openings 23b as a whole set in correspondence with the width of the irradiating opening 10. Even if the entire arrangement of the first and second openings 23a and 23b is smaller in width than the irradiating opening 10, the flow of supplied gas spreads widely, and thus the gas can be supplied satisfactorily into an atmosphere in the region irradiated with light from the irradiating opening 10.

The flow path 21 in this embodiment is arranged so that an end thereof is located near the irradiating opening 10 of the light-irradiating surface 9a. That is, one or some of the plate-like members 24 of the flow path 21 are kept in contact with the light-irradiating surface 9a. In a light-irradiating device of the related art, for example, a photo-curable material adhering to the irradiating opening 10 may absorb light and consequently generate heat, which results in a fracture in a cover glass, for example. By contrast, since the light-irradiating device 1 according to the disclosure includes the above constitution, the flow path 21 for gas which is supplied whenever necessary is disposed on part of the light-irradiating surface 9a, and this can improve heat dissipation from the light-irradiating surface 9a. Thus, it is possible to suppress the occurrence of fracture in the light-irradiating surface 9a. In this embodiment, the light-irradiating surface 9a includes the irradiating opening 10 and the non-light passing portion, and, the flow path 21 is connected to the non-light passing portion alone.

The irradiating opening 10 may be displaced from the center of the light-irradiating surface 9a in the opposite direction to the location of the flow path 21. This makes it possible to increase the area of the non-light passing portion where the flow path 21 is located, and thus improve heat dissipation from the light-irradiating surface 9a.

Alternatively, the irradiating opening 10 may be located at the center of the light-irradiating surface 9a. The placement of the irradiating opening 10 is determined in conformance with design requirements.

Some of the plurality of plate-like members 24 constituting the flow path 21 may constitute the housing 9. In this case, the surface of the housing 9 can be exposed directly to the gas flowing within the flow path 21, with consequent improvement in heat dissipation from the housing 9.

Moreover, the housing 9 includes a side surface 9b connected to the light-irradiating surface 9a, and the flow path 21 is preferably disposed so as to extend from the side surface 9b of the housing 9 to the light-irradiating surface 9a. That is, as shown in FIG. 1A, it is preferable that the housing 9 includes the side surface 9b connected to the light-irradiating surface 9a, and the flow path 21 is connected to the side surface 9b of the housing 9, and is arranged so as to extend from the side surface 9b to the light-irradiating surface 9a. Consequently, by the gas flowing within the flow path 21, it is possible to improve heat dissipation not only from the light-irradiating surface 9a of the housing 9 but also from the side surface 9b of the housing 9. Moreover, even if the flow path 21 is not shaped so as to be folded over onto the light-irradiating surface 9a as described earlier, improvement in heat dissipation from the side surface 9b of the housing 9 can be achieved.

Figure 3A:
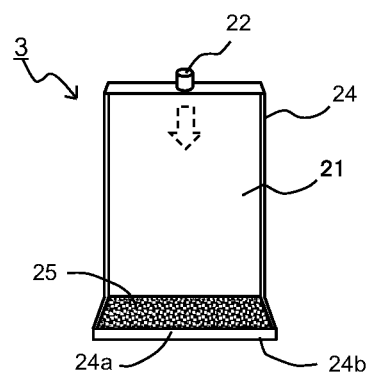
FIGS. 3A to 3C are each a perspective view showing an example of the interior of a flow path in the embodiment of the light-irradiating device according to the disclosure.
Figure 3B:
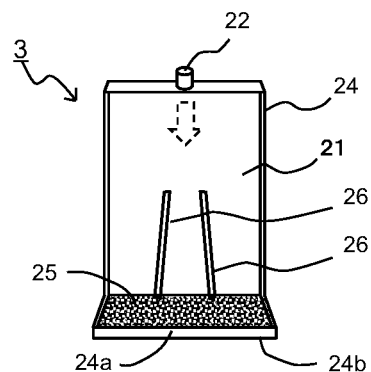
Figure 3C:
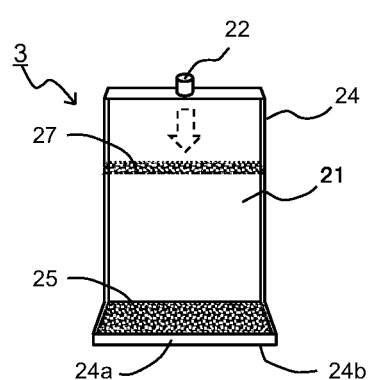

In order to discharge the gas uniformly from the discharging port 23, various design ideas can be adopted in the implementation of the flow path 21 of the gas supply section 3. A few examples of the design of the flow path are shown in FIGS. 3A to 3C. FIGS. 3A to 3C are each a perspective view showing an example of the interior of the flow path provided in the embodiment of the light-irradiating device according to the disclosure.

As shown in FIG. 3A, the gas supply section 3 preferably includes a porous member 25 disposed on a flow path 21 side of the discharging port 23. This makes it possible to restrain a non-uniform flow of gas in a location just before the discharging port 23, and thus discharge the gas in a uniform flow from the discharging port 23. Thus, uneven distribution of gas discharge toward the medium for printing can be reduced, with consequent improvement in the cure of the photo-curable material.

As such porous member 25, it is possible to use any member, including various porous materials conforming to gas-discharge performance requirements, for providing a certain resistance against the passage of gas so as to restrain the gas from flowing in a non-uniform state. Examples of such a member include net-like members (mesh members) such as a wire mesh including fine mesh openings relative to the open area ratio in the arrangement of the plurality of first openings 23a, hard porous members such as a pumice stone and porous ceramics, and fibrous porous members such as a woven fabric, a nonwoven fabric, and steel wool. The size, thickness, etc. of the porous member 25 may be appropriately adjusted according to the material used. Moreover, the material quality does not necessarily have to be uniform throughout the porous member 25 over the entire discharging port 23, and thus a combination of a plurality of materials of varying quality may be used in conformance with the following design ideas adopted for the flow path.

In the case where the porous member 25 is located, on a flow path 21 side of the discharging port 23, the porous member 25 may be either placed in contact with the plate-like member 24 provided with the discharging port 23 or spaced a short distance away from the plate-like member 24.

Next, as shown in FIG. 3B, in the gas supply section 3, the flow path 21 is preferably divided into a plurality of branches upstream from the discharging port 23. Although immediately after the supply of gas from the supply port 22, the distribution of gas supply occurs along the width of the flow path 21, the distribution can be adjusted according to the placement of such branches, and therefore it is possible to discharge the gas in a uniform flow from the discharging port 23, and thus reduce uneven distribution of gas discharge toward the medium for printing, ensuring improvement in the cure of the photo-curable material.

For example, the branches may be obtained by setting a plurality of flow-adjusting plates 26 in the interior of a part of the flow path 21 which extends along the side surface 9b of the housing 9. In this embodiment, each flow-adjusting plate 26 is arranged so as to be inclined toward the corresponding end of the flow path from the center thereof in the width direction with respect to the direction of gas flow. This allows the gas from the supply port 22 located at the center of the flow path 21 in the width direction to flow more smoothly toward each end area than toward the central area within the flow path 21, and thus permits regulation of the flow of gas which tends to travel exclusively toward the center of the arrangement of the discharging port 23. Such flow-adjusting plates 26 may either be arranged parallel to the direction of gas flow or be arranged at random intervals in the direction of width of the flow path 21. Moreover, means for constituting the branches is not limited to plate-like members such as the flow-adjusting plates 26. For example, wide members arranged in a direction perpendicular to the direction of gas flow may define branches of reduced width dimension. Moreover, for adjustment to the distribution of gas discharge from the discharging port 23, such a flow path including a plurality of branches may be combined with the porous members 25 having different characteristics arranged in correspondence with the branches.

Next, as shown in FIG. 3C, in the gas supply section 3, the flow path 21 is preferably provided with a second porous member 27 spaced at a predetermined distance upstream from the discharging port 23. Thus, since uneven distribution of gas supply from the supply port 22 can be adjusted by the second porous member 27 positioned upstream from the discharging port 23 in closer vicinity to the supply port 22, it is possible to discharge the gas in a uniform flow from the discharging port 23, and thus reduce uneven distribution of gas discharge toward the medium for printing, ensuring improvement in the cure of the photo-curable material.

The second porous member 27 may be formed of a material similar to the material used for the porous member 25. The second porous member 27 is preferably dimensioned to extend over the entire area of the section of the flow path 21. The thickness of the second porous member 27 may be appropriately adjusted according to the material used and the material quality. Moreover, as the material and the material quality of the second porous member 27, a plurality of materials may be used in combination in the width or thickness direction of the flow path 21.

The porous member 25, the flow-adjusting plates 26 for dividing the flow path into branches, and the second porous member 27 shown in FIGS. 3A to 3C may be used alone or in combination.

Next, the flow path 21 is preferably constituted of a plurality of mutually connected plate-like members 24. This affords flexibility in the formation of the flow path 21. The plurality of plate-like members 24 constituting the flow path 21 and the housing 9 may be formed of the same material. In this case, it is possible to suppress the occurrence of separation of the flow path 21 from the housing 9 due to the difference in thermal expansion between the plate-like member 24 and the housing 9. In the case where one of the plate-like members 24 constituting the flow path 21 constitutes the housing 9, the plate-like member 24 shared with the housing 9 is treated as the housing 9. The plurality of plate-like members 24 constituting the flow path 21 and the housing 9 may be formed of different materials when the plate-like members 24 are substantially equal in thermal conductivity to the housing 9.

The plurality of plate-like members 24 constituting the flow path 21 include a first plate-like member 24*a* located nearest to the irradiating opening 10 and a second plate-like member 24*b* located nearest to the medium for printing.

The first plate-like member 24*a* is preferably arranged along an edge of the irradiating opening 10. That is, in this embodiment, the irradiating opening 10 has a strip form extending from one end of the light-irradiating surface 9*a* to the other end thereof. Accordingly, the first plate-like member 24*a* is arranged, along the flow path 21-side edge of the irradiating opening 10, so as to extend in the width direction between one end and the other end of the light-irradiating surface 9*a*. This makes it possible to increase the degree of uniformity in the intensity distribution of light entering the medium for printing, e.g. light which has been emitted from the irradiating opening 10, then reflected from the first plate-like member 24*a*, and entered the medium for printing.

The first plate-like member 24*a* preferably is inclined so as to be away from the irradiating opening 10 as going from the light-irradiating surface 9*a* toward a light-irradiating direction. In other words, the first plate-like member 24*a* may be inclined so that the flow path 21 becomes narrower gradually with increasing proximity to the medium for printing. This makes it possible to restrain the light applied through the light-irradiating surface 9*a* from being blocked by the first plate-like member 24*a*.

A surface of the first plate-like member 24*a* on the irradiating opening 10 side is preferably in a state of reflecting light from the light-emitting element 4. More specifically, preferably, the first plate-like member 24*a* is formed of a metal material, and the surface on the irradiating opening 10 side may be relatively close to a mirror surface. Thus, since light entering the first plate-like member 24*a* through the irradiating opening 10 can be reflected toward the medium for printing, it is possible to achieve improvement in the cure of the photo-curable material.

The second plate-like member 24*b* located on the bottom side of the light-irradiating device 1 is provided with the discharging port 23. Thus, the distance between the medium for printing and the discharging port 23 can be reduced.

In the case where the discharging port 23 is disposed in the second plate-like member 24*b*, the second plate-like member 24*b* may be parallel to the light-irradiating surface 9*a*. As a rule, the light-irradiating surface 9*a* is opposed in parallel to the medium for printing. Thus, when the second plate-like member 24*b* is parallel to the light-irradiating surface 9*a*, the gas can be discharged and sprayed on the medium for printing at the shortest distance.

Figure 4:
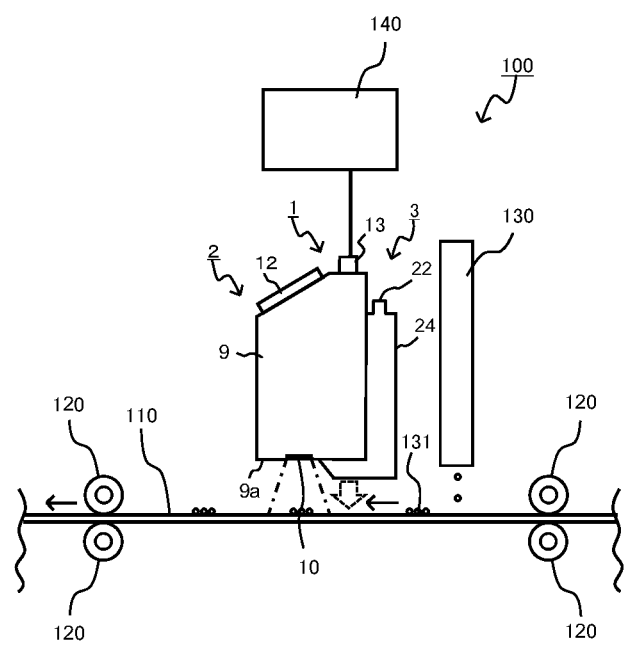
FIG. 4 is a front view schematically showing the structure of an embodiment of a printing device according to the disclosure.

FIG. 4 is a front view schematically showing the structure of an embodiment of a printing device according to the disclosure. The printing device 100 shown as the embodiment in FIG. 4 includes a printing section 130 which carries out printing on a medium for printing 110 which is being conveyed by a conveying section 120, and the light-irradiating device 1 according to the disclosure which applies light to the medium for printing 110 under conveyance following the completion of the printing. Since a printing ink used in the printing section 130 is a photo-curable ink, the medium for printing 110 printed with the ink constitutes a photo-curable material. The light-irradiating device 1 according to the disclosure and the conveying section 120 which conveys the photo-curable material to which the gas from the discharging port 23 of the light-irradiating device 1 is supplied and which is irradiated with light from the irradiating opening 10, make up a light cure device according to the disclosure. That is, the printing device 100 according to the disclosure includes: the light cure device according to the disclosure including the light-irradiating device 1 according to the disclosure and the conveying section 120 which conveys the photo-curable material which is irradiated with light from the irradiating opening 10 under the supply of gas from the discharging port 23 of the light-irradiating device 1; and the printing section 130 which prints photo-curable ink 131 on the medium for printing 110 as the photo-curable material.

In the printing device 100, the photo-curable ink 131 is adherently applied to the medium for printing 110 which is being conveyed by the conveying section 120, and subsequently the photo-curable ink 131 is cured by the light-irradiating device 1, whereby printing can be carried out on the medium for printing 110 as desired. At this time, since the light-irradiating device 1 applies light while releasing oxygen-free gas of satisfactory distribution into between the device and the medium for printing 110, this makes it possible to carry out cure under light while reducing curing reaction-inhibiting oxygen in the atmosphere, and thereby achieve improvement in the cure of the photo-curable ink 131.

In FIG. 4, the alternate long and short dashed lines drawn from the irradiating opening 10 indicate a range of light irradiation, and the dashed arrow depicted below the gas supply section 3 indicates a direction of gas discharge.

The conveying section 120 enables the medium for printing 110 to pass successively through the printing section 130 and the light-irradiating device 1 in the order named. The conveying section 120 including a pair of conveying rollers which are located so as to face each other and are rotatably supported, and also, on an as needed basis, a support table which is movable while carrying the medium for printing 110. The conveying section 120 feeds the medium for printing 110 into between the pair of conveying rollers, and then rotates the conveying rollers, ensuring the delivery of the medium for printing 110 in a conveyance direction.

The printing section 130 has a function of printing the photo-curable ink 131 in a desired pattern on the medium for printing 110 which is being conveyed by the conveying section 120, constituting the photo-curable material. The printing section 130, which may be constructed of an ink-jet (IJ) head, is configured to direct a discharge of photo-curable ink droplets toward the medium for printing 110, ensuring that the droplets are applied adherently to the medium for printing 110. For example, ultraviolet-curable ink is adopted as the photo-curable ink 131. Alternatively, for example, a photoresist or photo-curable resin can also be used.

While, in this embodiment, a line-type IJ head is exemplified as the printing section 130, the printing section 130 is not limited to this. For example, a serial-type IJ head may be adopted. In another alternative, for example, as the printing section 130, an offset printing machine, a flexographic printing machine, a screen printing machine, or the like that employ ultraviolet-curable ink may be adopted.

In the printing device 100, the conveying section 120 conveys the medium for printing 110 in the conveyance direction which is a direction from right to left, as viewed in the drawing. The printing section 130 directs a discharge of, for example, ultraviolet-curable ink 131, toward the medium for printing 110 under conveyance, ensuring that the ink 131 adheres to the surface of the medium for printing 110. At this time, the ink 131 may be caused to adhere to either the entire area or part of the surface of the medium for printing 110 in any desired pattern. In the printing device 100, the ultraviolet-curable ink 131 printed on the medium for printing 110 is cured under irradiation of ultraviolet light from the light-irradiating device 1.

The light cure device and the printing device 100 according to the disclosure benefit from the above-described advantageous effects achieved by the light-irradiating device 1 according to the disclosure.

In the printing device 100 according to this embodiment, the light-irradiating device 1 and the printing section 130 are arranged with the gas supply section 3 of the light-irradiating device 1 lying in between. With this arrangement, since the gas supply section 3 is located between the light-irradiating section 2 and the printing section 130, this makes it possible to reduce the occurrence of clogging in the discharge hole of the printing section 130 caused by entry of the light from the light-irradiating section 2 to the printing section 130.

A control section 140 connected to the light-irradiating device 1 has a function of controlling light emission of the light-irradiating device 1. The control section 140 includes a memory therein, and the memory stores information indicating characteristics of light that allows relatively good cure of the photo-curable ink 131 discharged from the IJ head serving as the printing section 130.

Specific examples of the stored information include numerical values representing wavelength distribution characteristics and light emission intensity (emission intensity of light in each wavelength range) suited to the cure of the photo-curable ink 131 discharged in droplet form. By virtue of the control section 140, the printing device 100 according to this embodiment is also capable of adjusting, on the basis of the information stored in the control section 140, the magnitude of drive current which is inputted to a plurality of the light-emitting elements 4 serving as a light source. Thus, according to the printing device 100, the light-irradiating device 1 can apply light of adequate quantity in accordance with the characteristics of the ink 131 in use, and this enables the photo-curable ink 131 to be cured with light of relatively low energy.

Moreover, while, in this embodiment, the printing device 100 using an IJ head as the printing section 130 includes the light-irradiating device 1, the light-irradiating device 1 is also applicable to various resin-curing devices as a light cure device for curing a photo-curable material, such as a material in which a paste such as resist is spin-coated on the surface of an object or a material in which a photo-curable resin is screen-printed, under conveyance by light irradiation.

In accordance with the light-irradiating device, the light cure device, and the printing device according to the disclosure, since it is possible to achieve a reduction of non-uniform flow of gas which has been supplied from the flow path and then discharged from the discharging port, and thus to achieve a reduction of curing reaction-inhibiting atmospheric oxygen in the vicinity of the photo-curable material such as the medium for printing, it is possible to achieve improvement in the cure of the photo-curable material.

Although specific embodiments of the disclosure have been detailed herein, it is to be understood that the disclosure is not limited to the above-described embodiments, and hence various changes, modifications, and improvements may be made therein without departing from the gist of the disclosure.

REFERENCE SIGNS LIST

1: Light-irradiating device
2: Light-irradiating section
3: Gas supply section
4: Light-emitting element
9: Housing
9a: Light-irradiating surface
9b: Side surface
10: Irradiating opening
21: Flow path
23: Discharging port
23a: First opening
23b: Second opening
24: Plate-like member
24a: First plate-like member
24b: Second plate-like member
25: Porous member
27: Second porous member
100: Printing device
110: Medium for printing
120: Conveying section
130: Printing section
131 Photo-curable ink (ink)

The invention claimed is:

1. A light-irradiating device, comprising:
a light-emitting element;
a housing in which the light-emitting element is disposed, the housing comprising a light-irradiating surface provided with an irradiating opening which allows light from the light-emitting element to pass therethrough, the irradiating opening extending in a width direction of the light-irradiating surface;

a flow path configured to supply gas, the flow path comprising an end located near the irradiating opening of the light-irradiating surface of the housing; and a discharging port configured to discharge the gas, the discharging port disposed at the end of the flow path, the discharging port comprising a plurality of first openings which are each shaped in a circular hole arranged in a range of an area in the width direction corresponding to the irradiating opening, and a second opening as a narrow elongate form positioned at each end of the discharging port in the width direction in conformity with the area.

2. The light-irradiating device according to claim 1, further comprising:

a porous member disposed on a flow path side of the discharging port.

3. The light-irradiating device according to claim 1, wherein the flow path is divided into a plurality of branches upstream from the discharging port.

4. The light-irradiating device according to claim 1, wherein the flow path is provided with a second porous member spaced at a predetermined distance upstream from the discharging port.

5. The light-irradiating device according to claim 1, wherein the housing comprises a side surface connected to the light-irradiating surface, and the flow path is disposed so as to extend from the side surface of the housing to the light-irradiating surface.

6. The light-irradiating device according to claim 1, wherein the flow path is constituted of a plurality of plate-like members connected to each other.

7. The light-irradiating device according to claim 6, wherein the plurality of plate-like members constituting the flow path comprise a first plate-like member which is located along an edge of the irradiating opening.

8. The light-irradiating device according to claim 7, wherein the first plate-like member is inclined away from the irradiating opening, and extends from the light-irradiating surface toward a light irradiating direction.

9. The light-irradiating device according to claim 7, wherein a surface of the first plate-like member, which is located close to the irradiating opening, reflects light from the light-emitting element.

10. A light cure device, comprising:

the light-irradiating device according to claim 1; and a conveying section configured to convey a photo-curable material to which the gas from the discharging port of the light-irradiating device is supplied, and which is irradiated with light from the irradiating opening.

11. A printing device, comprising:

the light cure device according to claim 10; and a printing section configured to print photo-curable ink on a medium for printing comprising the photo-curable material.

* * * * *